United States Patent [19]

Auvray

[11] Patent Number: 5,204,683
[45] Date of Patent: Apr. 20, 1993

[54] RADAR RECEIVER FOR A RADAR HAVING A DIGITAL BEAM FORMING ANTENNA

[75] Inventor: Gérard Auvray, Longpont sur Orge, France

[73] Assignee: Thomson-CSF, Paris, France

[21] Appl. No.: 728,327

[22] Filed: Jul. 8, 1991

Related U.S. Application Data

[63] Continuation of Ser. No. 300,650, Jan. 17, 1989, abandoned.

[30] Foreign Application Priority Data

Jan. 22, 1988 [FR] France .............................. 88 00681

[51] Int. Cl.⁵ .............................................. G01S 13/00
[52] U.S. Cl. ...................................................... 342/150
[58] Field of Search ................................. 342/150, 151

[56] References Cited

U.S. PATENT DOCUMENTS

| | | |
|---|---|---|
| 3,950,750 | 4/1976 | Churchill et al. . |
| 4,368,468 | 1/1983 | Lisle et al. . |
| 4,499,466 | 2/1985 | Torino, Jr. et al. . |
| 4,529,986 | 7/1985 | d'Auria et al. . |
| 4,573,052 | 2/1986 | Guillerot et al. . |
| 4,646,093 | 2/1987 | Postema et al. ...................... 342/151 |
| 4,652,882 | 3/1987 | Shovlin et al. ...................... 342/150 |

FOREIGN PATENT DOCUMENTS

| | | |
|---|---|---|
| 0128797 | 12/1984 | European Pat. Off. . |
| 88302013.3 | 9/1988 | European Pat. Off. . |
| 8119380 | 4/1983 | France . |
| 214570A | 3/1985 | United Kingdom . |

OTHER PUBLICATIONS

Radar Handbook, incl. preface and portions of Ch. 11 and 35 and pp. 3-2, 3—3, 20—20 and 20-21.
"Digital Beamforming Antennas, An Introduction" by Hans Steyskal, 176 Microwave Journal 30 (1987) Jan., No. 1.
Search Report for Fr. 88 00681 filed Jan. 22, 1988.
PCT appl. WO 85/04995, Nov. 7, 1988 for "Extended Threshold Analog to Digital Conversion Apparatus for an RF Receiver".

*Primary Examiner*—Theodore M. Blum
*Attorney, Agent, or Firm*—Pollock, VandeSande & Priddy

[57] ABSTRACT

This radar receiver, in particular for a radar having an antenna with beam forming through computation, comprises essentially means for matched filtering having a bandwidth B, means for amplitude and phase detection, and means for analog-to-digital conversion, and is such that said means for analog-to-digital conversion work on the intermediate-frequency signals, at a frequency much higher than said intermediate frequency. The receiver can be fully constructed in gallium arsenide technology.

10 Claims, 2 Drawing Sheets

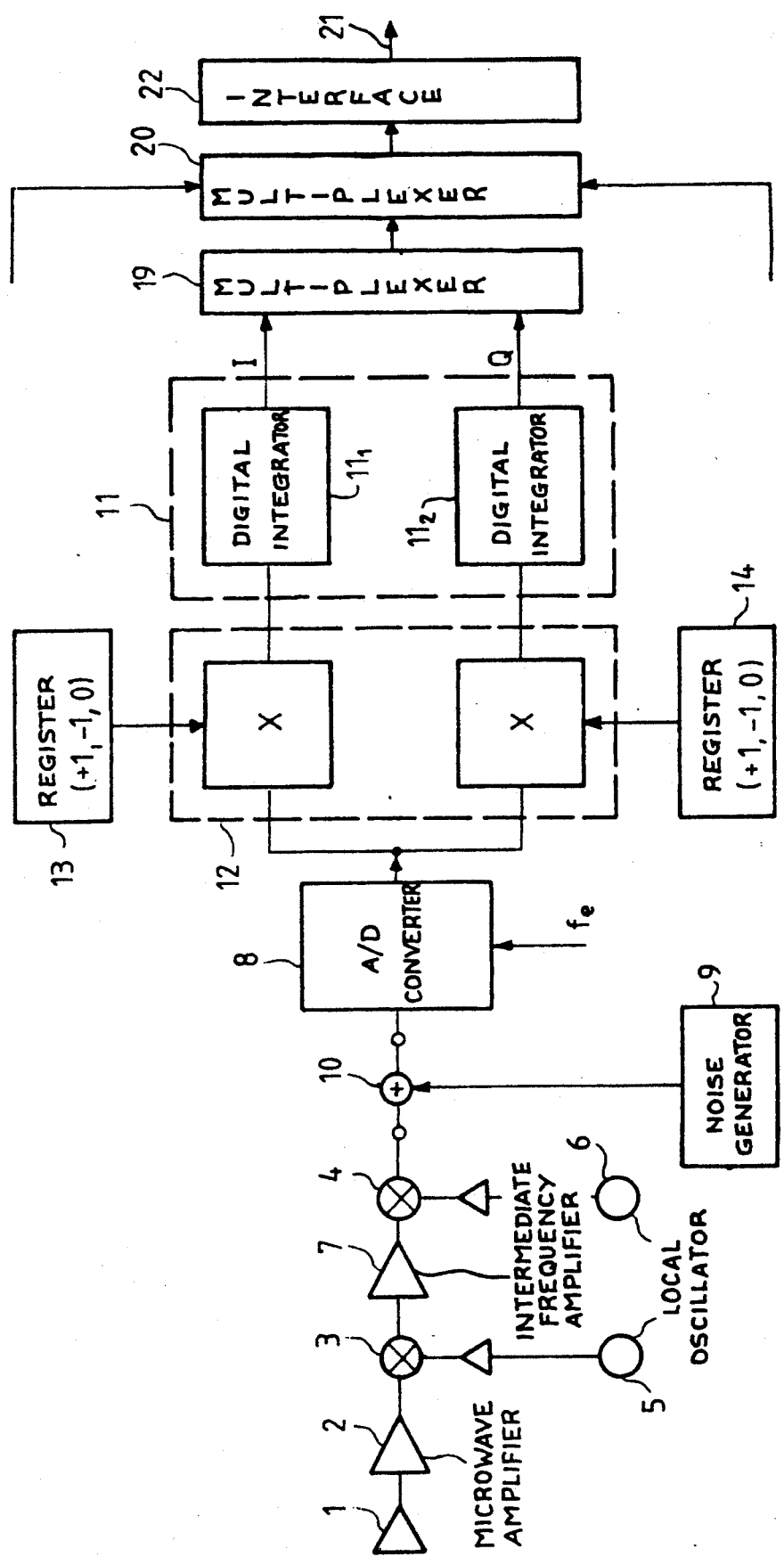

FIG_2
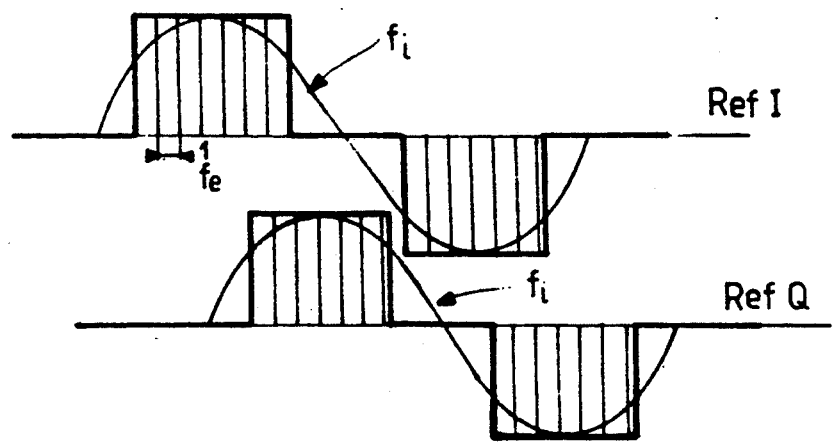
FIG_3
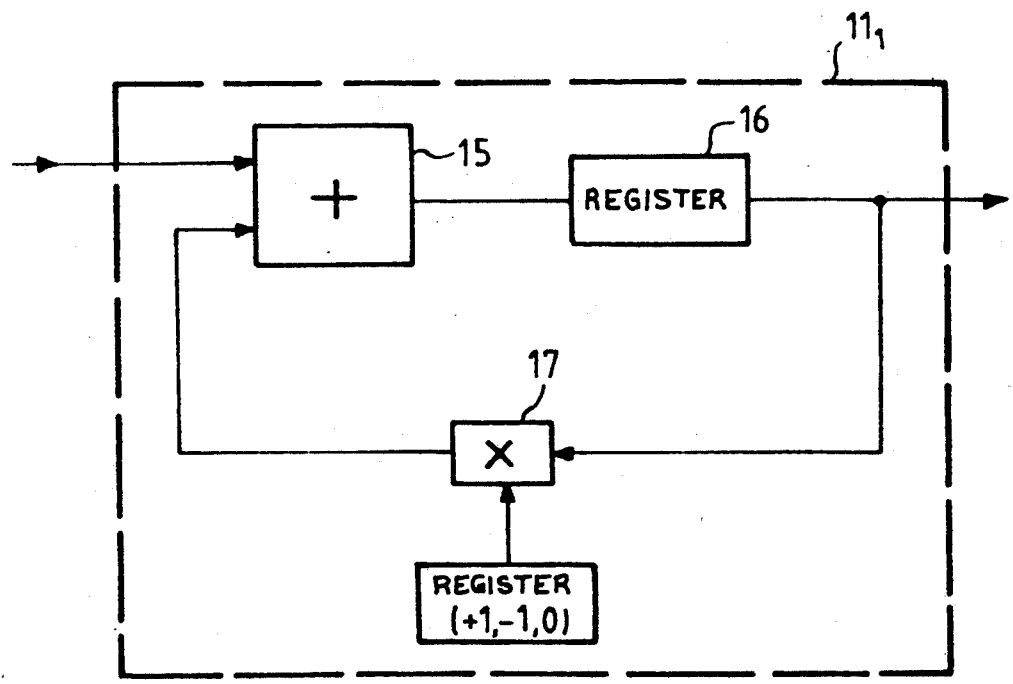

RADAR RECEIVER FOR A RADAR HAVING A DIGITAL BEAM FORMING ANTENNA

This application is a continuation of application Ser. No. 07/300,650, filed Jan. 17, 1989, now abandoned.

BACKGROUND OF THE INVENTION

1. Field of the invention

The present invention relates to a radar receiver, in particular for a radar having a digital beam forming antenna.

2. Description of the prior art

It is known that a digital beam forming antenna is made up of a multitude of elemental sensors, each associated with an elemental receiver; a common processing device combines the digital signals from the various elemental receivers in order to form the desired beam in the receiving mode.

SUMMARY OF THE INVENTION

A problem arises due to the high number of interconnections between the various elemental receivers and the common processing device. To limit this number of interconnections, it would be interesting to use an optical fiber as a transmission medium. However, the use of an optical fiber poses the problem of technological homogeneity between the radar receivers and the electro-optical transducers, the latter using components based on gallium arsenide (GaAs) while the former uses only partially this type of components.

An object of the present invention is a radar receiver that can be fully implemented by means of components based on gallium arsenide.

Furthermore, in the case of an "active" antenna, in which the receivers are integrated into the structure proper of the antenna, there is the problem of miniaturizing these receivers, which cannot be achieved by using the conventional scheme of a radar receiver, in which the in phase and quadrature demodulation function is in general an analog function and cannot, therefore, be integrated.

A second object of the present invention is the achievement of this integration.

An object of the present invention is a radar receiver, in particular for a radar having a digital beam forming antenna, including means for matched filtering having a bandwidth B, means for in phaser and quadrature detection, and means for analog-to-digital conversion, wherein said means for analog-to-digital conversion work on intermediate-frequency signals, at a frequency much higher than said intermediate frequency.

BRIEF DESCRIPTION OF THE DRAWINGS

The objects and features of the present invention will become apparent from a consideration of the following detailed description of a preferred embodiment given as a non-limitative example with reference to the accompanying drawings, in which:

FIG. 1 is a block diagram of a receiver according to the present invention;

FIG. 2 is a diagram showing the shape of the reference signals used to perform the step of in phase and quadrature demodulation;

FIG. 3 is a block diagram of the digital filter used at the output of the in phase and quadrature demodulator.

DESCRIPTION OF THE PREFERRED EMBODIMENT

The receiver shown in FIG. 1 comprises essentially, following a radiating element 1, various elements allowing implementation of the following functions: microwave amplification, down-conversion to intermediate frequency, filtering and amplification at intermediate frequency, analog-to-digital conversion, amplitude-phase demodulation, then low-pass matched filtering (this filtering also performs the rejection of the undesired components obtained at the completion of this in phase and quadrature demodulation).

Microwave amplification is carried out by a microwave amplifier 2. Down-conversion to intermediate frequency is performed in two successive steps by means of two mixers 3 and 4 associated with two local oscillators 5 and 6.

Amplification and filtering at the intermediate frequency and matched filtering are performed by an amplifier 7.

Let $f_i$ be the intermediate frequency, $nB$ the bandwidth of the intermediate-frequency signals, and $B$ the useful bandwidth (for example, $f_i = 60$ MHz, $B = 10$ MHz and $nB = 100$ MHz).

The elements thus described are easily implemented by means of components based on gallium arsenide.

The analog-to-digital conversion function is performed directly on the intermediate-frequency signals $f_i$; in addition, the sampling rate $f_e$ is chosen much higher than $f_i$ so that the analog-to-digital converter 8 can also be implemented in GaAs technology. In the case of the numerical values assumed above, $f_e$ may for example be equal to 1.2 GHz. Lower sampling rates such as 840 MHz or 600 MHz can also be used.

As will be shown hereinafter, performing the analog-to-digital conversion on the intermediate-frequency signals also allows to increase the radar dynamic range permitted by the analog-to-digital converter.

At the input of the analog-to-digital converter 8 there is injected, by means of an adder 10, noise generated by a noise generator 9, in a frequency band $(n-1)B$ so that the noise present at the input of the analog-to-digital converter 8 is within the band $nB$ and is white noise. The introduction of this noise generator also has the effect of increasing the radar dynamic range permitted by the analog-to-digital converter, or alternatively to allow the use of a converter with a reduced dynamic range (or a reduced number of bits).

In the case of N-bit converters working on the video signals conventionally called "I signal" and "Q signal" (in-phase signal and quadrature signal), the radar dynamic range permitted by these converters is equal to $6N-15$ dB. These 15 dB are the sum of the 6 dB due to the fact that the signals to be encoded are bipolar signals, i.e., with positive or negative amplitude, the 3 dB due to the change from intermediate frequency to video frequency, and the 6 dB due to the fact that for the quantization noise to be negligible compared to radar noise (which is the reference element for the decision step performed in any radar processing), the quantization level $q$ must be chosen so that $\sigma = 2q$, where $\sigma$ denotes the standard deviation of radar noise.

In the case of the receiver in FIG. 1 and with the assumed numerical values, the radar dynamic range permitted by a converter having the same number N of bits and the same quantization level $q$ is equal to $6N-2$ dB.

As a matter of fact, the conversion is then performed on the intermediate-frequency signal (hence a 3-dB increase). Furthermore, the presence of the ratio "n" between the band nB in which is included the noise at the input of the converter 8 and the useful band B filtered by the integrating filter 11 that follows the in phase and quadrature demodulator 12 allows an additional gain in this ratio "n", that is 10 dB in the above example.

However, the gain of the receiving system preceding the converter 8 must be adjusted so that the relationship $\sigma = 2q$ is still verified with the new value of $\sigma$ corresponding to the radar noise in the band nB.

We may also assume that the introduction of the noise generator 9 has the effect, for one and the same radar dynamic range permitted by the converter 8, to allow the use of converters having a reduced dynamic range (or a reduced number of bits).

The digital signal obtained at the output of the converter 8 is distributed between two channels I and Q. The signals obtained in these two channels I and Q being digital signals, and furthermore oversampled in comparison with the intermediate frequency fi which is also the frequency of the reference signals cos $2\pi$fit and sin $2\pi$fit used to perform the amplitude-phase demodulation step, this step can be performed in a very simple manner.

As a matter of fact, these reference signals can be approximated by square waves oversampled at the rate fe as shown in FIG. 2.

It is then sufficient to store in two registers 13 and 14 a set of values ($+1$, $-1$, 0) representing these oversampled reference signals in a period and to multiply the samples obtained in the channels by these values.

This multiplication step reducing in fact to a simple step of sign changing or of zeroing depending on the value of the coefficient, it is then very easy to implement the in phase and quadrature demodulator in GaAs technology.

The reference signals being odd, there are no even harmonics of the frequency fi (60 MHz in the above example). Furthermore, the duration ratio of the signal steps to $\pm 1$ and to 0 can be adjusted to cancel the third harmonic of the frequency fi (or to minimize the overall power of the harmonics).

The function performed is consequently that of an analog in phase and quadrature demodulator without distortion and with a first spectral component rejected very far (540 MHz in the above example), hence a simplified filtering by the filter 11 to come back to the useful band B (10 MHz in this example).

One of the two digital filters, $11_1$ or $11_2$, inserted in one of the channels I, Q will now be described with reference to FIG. 3. This filter includes an adder 15 whose first input is supplied with the data from the I or Q channel, and whose second input is fed back from the output of this adder via a data register 16 and a multiplier 17 with coefficients ($+1$, $-1$, 0) stored in a coefficient register 18.

The application of these coefficients to the input samples is determined so as to obtain the desired transfer function of this filter.

Due to oversampling at the input of this filter, the application of the coefficients can be made in a progressive manner through the application of the coefficients $+1$, $-1$ or 0 to a set of correlated successive samples instead of applying a single coefficient to a single sample, which would be the case if the signal at the input of the filter was not oversampled.

It is thus possible to construct a filter 11 having a transfer function much closer to that desired and, therefore, to obtain a better elimination of the spurious beat signals obtained at the completion of the in phase and quadrature demodulation step.

Furthermore, the rate of the data at the output of the filter 11 being reduced in comparison with the data rate at the input of this filter, it is possible to first multiplex the two channels I and Q, and then the channels I and Q associated with various elemental transducers of a digital beam forming antenna, to a common output.

These multiplexers are denoted by 19 and 20 in FIG. 1.

This common output can then be connected to an optical fiber 21 by means of an interface 22.

What is claimed is:

1. A radar receiver comprising:
    a digital beam forming antenna including a plurality of elemental receivers, each of the elemental receivers comprising:
    a microwave amplifier receiving from an antenna element a received signal;
    a local oscillator;
    a mixer circuit connected to receive a signal from said microwave amplifier and a signal from said local oscillator converting said signal from said microwave amplifier into an intermediate frequency signal;
    an analog-to-digital converter for receiving said intermediate frequency signal, said analog-to-digital converter producing a digital signal from over sampling said intermediate frequency signal at a sampling rate much higher than said intermediate frequency signal frequency; and,
    means for forming two channels of quadrature related signals from said digital signal and for subsequently demodulating said quadrature signals.

2. A receiver according to claim 1, wherein said means for demodulating said quadrature related signals include, for each of the two quadrature related signals, means for multiplying the digitized signals at the output of the analog to digital converter by a series of $\pm -1$ coefficients representing the positive and negative half-cycles of a square wave whose frequency is equal to the frequency of the intermediate frequency.

3. A receiver according to claim 2, wherein a zero coefficient is used to cancel a third harmonic of a sinusoidal signal at said intermediate frequency produced by said square wave.

4. A receiver according to claim 2, wherein a zero coefficient is used to minimize the overall power of the harmonics of a sinusoidal signal at said intermediate frequency produced by said square wave.

5. A receiver according to claim 1, including means for adding to the received signals, before analog-to-digital conversion, noise in a band $(n-1)B$, nB being the frequency bandwidth of the intermediate frequency signal, and means for filtering said analog-to-digital converter output signal over a frequency band B.

6. A receiver according to claim 5, wherein said means for performing filtering over the frequency band B comprises an adder having a first input fed with the digital signal from said analog-to-digital converter and a second input fed from the output of said adder via a data register and a multiplier whose coefficients ($+1$, $-1$, 0) are stored in a coefficient register.

7. A receiver according to claim 1, wherein signals from the said means for demodulating in phase and quadrature signals are multiplexed into a single channel.

8. A receiver according to claim 2, wherein signals from said means for demodulating in phase and quadrature related signals of the various elemental receivers of a radar having a digital beam forming antenna are multiplexed to a single channel.

9. A receiver according to any of claims 7 or 8, wherein said single channel is connected to an optical fiber.

10. A receiver according to claim 1, wherein the receiver is fabricated in a gallium arsenide integrated circuit.

* * * * *